(12) United States Patent
Zhou

(10) Patent No.: US 11,374,076 B2
(45) Date of Patent: Jun. 28, 2022

(54) DISPLAY PANEL INCLUDING CRACK PREVENTION STRUCTURES

(71) Applicant: WUHAN CHINA STAR OPTOELECTRONICS SEMICONDUCTOR DISPLAY TECHNOLOGY CO., LTD., Wuhan (CN)

(72) Inventor: Zhiwei Zhou, Wuhan (CN)

( * ) Notice: Subject to any disclaimer, the term of this patent is extended or adjusted under 35 U.S.C. 154(b) by 164 days.

(21) Appl. No.: 16/768,891

(22) PCT Filed: Jan. 3, 2020

(86) PCT No.: PCT/CN2020/070224
§ 371 (c)(1),
(2) Date: Jun. 2, 2020

(87) PCT Pub. No.: WO2021/120341
PCT Pub. Date: Jun. 24, 2021

(65) Prior Publication Data
US 2021/0408189 A1    Dec. 30, 2021

(30) Foreign Application Priority Data

Dec. 20, 2019  (CN) .......................... 201911330942.5

(51) Int. Cl.
| | | |
|---|---|---|
| *H01L 27/12* | (2006.01) |
| *H01L 27/32* | (2006.01) |
| *H01L 33/12* | (2010.01) |
| *H01L 51/00* | (2006.01) |
| *H01L 51/52* | (2006.01) |
| *G06F 1/16* | (2006.01) |

(52) U.S. Cl.
CPC ...... *H01L 27/3258* (2013.01); *H01L 51/0097* (2013.01); *H01L 33/12* (2013.01); *H01L 51/5253* (2013.01); *H01L 2251/301* (2013.01); *H01L 2251/5338* (2013.01)

(58) Field of Classification Search
CPC ............ H01L 27/3258; H01L 51/0097; H01L 51/5253; H01L 2251/301; H01L 23/562; H01L 27/1218; H01L 27/3244; H01L 2251/5338; H01L 33/12; G06F 1/1652
See application file for complete search history.

(56) References Cited

U.S. PATENT DOCUMENTS 5,763,936 A * 6/1998 Yamaha ............... H01L 23/3171
                                                    257/644
9,219,104 B2 * 12/2015 Jeon .................... H01L 27/3246
(Continued)

*Primary Examiner* — Ida M Soward

(57) ABSTRACT

A display panel is provided, which includes a display area, an encapsulation area, and a frame area, wherein the encapsulation area includes a first encapsulation area and a second encapsulation area, multiple layers of crack prevention structures are disposed in sequence in the frame area and the second encapsulation area and on a side of the first encapsulation area adjacent to the frame area, and each of the multiple layers of the crack prevention structures are present as a dashed circle structure, and includes at least one groove, and the organic layer fills the groove, and wherein grooves of one layer of the multiple layers of the crack prevention structures and grooves of another layer of the multiple layers of the crack prevention structures adjacent to the one layer are mutually staggered.

11 Claims, 2 Drawing Sheets

(56) References Cited

U.S. PATENT DOCUMENTS

| | | | | |
|---|---|---|---|---|
| 9,425,429 | B2* | 8/2016 | Kamiya | H01L 27/3246 |
| 9,824,982 | B1* | 11/2017 | Briggs | H01L 21/76816 |
| 10,216,023 | B2* | 2/2019 | Namkung | H01L 51/5253 |
| 10,644,261 | B2* | 5/2020 | Lee | H01L 51/5253 |
| 10,978,671 | B2* | 4/2021 | Gong | H01L 51/5256 |
| 11,024,687 | B2* | 6/2021 | Zhang | H01L 27/3272 |
| 11,056,548 | B1* | 7/2021 | Wang | H01L 27/1218 |
| 11,152,438 | B2* | 10/2021 | Yang | H01L 51/5215 |
| 2017/0117502 | A1* | 4/2017 | Park | H01L 51/56 |
| 2017/0346041 | A1* | 11/2017 | Kim | H01L 51/0097 |
| 2018/0240852 | A1* | 8/2018 | Chen | H01L 27/3258 |
| 2019/0131569 | A1* | 5/2019 | Ma | H01L 51/5253 |
| 2020/0013834 | A1* | 1/2020 | Park | H01L 51/5253 |
| 2020/0083314 | A1* | 3/2020 | Choi | H01L 27/3262 |
| 2020/0273930 | A1* | 8/2020 | Zhou | H01L 27/3276 |
| 2020/0395573 | A1* | 12/2020 | Zhang | H01L 27/3258 |
| 2021/0257424 | A1* | 8/2021 | Byun | H01L 27/3276 |
| 2021/0327982 | A1* | 10/2021 | Zhou | H01L 27/3246 |
| 2021/0335931 | A1* | 10/2021 | Wang | H01L 27/3246 |
| 2021/0336205 | A1* | 10/2021 | Wang | H01L 51/56 |
| 2021/0343984 | A1* | 11/2021 | Wang | H01L 51/5253 |
| 2021/0408179 | A1* | 12/2021 | Ni | H01L 27/3246 |
| 2021/0408471 | A1* | 12/2021 | Xiao | H01L 27/3258 |

* cited by examiner

DISPLAY PANEL INCLUDING CRACK PREVENTION STRUCTURES

BACKGROUND OF INVENTION

Field of Invention

The present invention relates to a field of display, and in particular to a display panel.

Description of Prior Art

When bending an organic light-emitting diode (OLED) display panel, an unstable area of the edge usually becomes a starting position of a crack because on the one hand, an inorganic film layer in the frame area of the display panel may cause micro-cracks invisible to naked eyes during cutting, and on the other hand, a crystal lattice at an edge is suddenly terminated to form a large number of dangling bonds and defects.

However, in an inorganic thin film of the display panel, there is an intrinsic stress or an intrinsic defect. If the display area and the frame area are not protected in any way, the micro-cracks will expand to a position of the display panel encapsulation film without being blocked by any structure. When the display panel is bent, the intrinsic stress existing in the inorganic thin film (i.e., the intrinsic defect), and the non-intrinsic stress such as adhesion of the thin film to the substrate will continue to further promote expansion of the micro-cracks, and when the frame area is not protected, the micro-cracks will expand to a position of the display panel encapsulation film without being blocked by any structure. Under tens of thousands of repeated bending, when the inorganic encapsulation having intrinsic brittleness and more defects cracks, water and oxygen in the atmosphere will invade. As triplet quenchers, water and oxygen not only oxidize organic compounds in a light-emitting layer to generate carbonyl compounds, but also electrochemically corrode alkali metals or alkaline earth metals in a cathode material, such that while significantly reducing luminescent quantum efficiency, a large number of black dot defects will be formed due to deterioration of the light-emitting material, which will greatly impact a service life of a device, thereby threatening normal display of an entire display panel.

Based on the above considerations, it is found in an analysis of an actual bending test that the existing crack prevention structures are independently distributed grooves, which are difficult to pass the test of small bending radius and external bending, and micro-cracks will bypass the crack prevention structures and expand out from other locations. It is not difficult to find that the reason for presence of the above phenomenon is not only related to a relative position and a size of the crack prevention structure, but also to an overall width of the crack prevention structure in the frame area of the display panel. Therefore, there is an urgent need to develop a novel display panel to overcome the defects in the prior art.

SUMMARY OF INVENTION

An object of the present invention is to provide a display panel, by integrally setting a patterned, diverse, and open-type crack prevention structures of various sizes, and various shapes in the frame area and on a side of the encapsulation area adjacent to the frame area, to effectively improve technical problems such as abnormal image quality caused by crack expansion during bending, thereby increasing a number of dynamic bending.

In order to solve the above problems, the present invention provides a display panel including a display area, an encapsulation area, and a frame area, wherein the encapsulation area includes: a first encapsulation area connected to the display area and disposed around the display area; and a second encapsulation area disposed around the first encapsulation area, and having an inner side connected to the first encapsulation area and an outer side connected to the frame area; wherein multiple layers of crack prevention structures are disposed in sequence in the frame area and the second encapsulation area and on a side of the first encapsulation area adjacent to the frame area, and each of the multiple layers of the crack prevention structures are present as a dashed circle structure around the display area; each of the crack prevention structures includes at least one groove; grooves of one layer of the multiple layers of the crack prevention structures and grooves of another layer of the multiple layers of the crack prevention structures adjacent to the one layer are mutually staggered; and the encapsulation area and the frame area include a flexible substrate layer, a buffer layer, a first insulating layer, a second insulating layer, a dielectric layer, and an organic layer sequentially stacked from bottom to top, the grooves penetrate the first insulating layer, the second insulating layer, and the dielectric layer sequentially from bottom to top, and the grooves are filled with the organic layer.

Further, each of the grooves has a length extending in a direction in which the crack prevention structures surround the display area.

Further, the grooves are rectangular.

Further, an interval distance between adjacent ones of the grooves in a direction in which the crack prevention structures surround the display area is less than or equal to half of a length of the groove.

Further, each of the grooves has a semicircular fan shape.

Further, an interval distance between adjacent ones of the grooves in a direction in which the crack prevention structures surround the display area is equal to a width of the grooves.

Further, the grooves include: an outer side having a semicircular arc shape; and an inner side having a semicircular arc shape, wherein the inner side and the outer side are concentric circles, a diameter of a circle where the inner side is located is smaller than a diameter of a circle where the outer side is located, a difference in diameter between the circle in which the inner side is located and the circle where the outer side is located is greater than or equal to 2 times a width of each of the grooves and less than or equal to 3 times the width of each of the grooves.

Further, each of the grooves has a U-shape.

Further, an interval distance between adjacent ones of the grooves is equal to a width of the grooves.

Further, a notch width of each of the grooves is greater than or equal to 4 times a width of each of the grooves; and a length of each of the grooves is greater than or equal to 7 times the width of each of the grooves.

Further, openings of the grooves of the crack prevention structures located in two adjacent layers of the multiple layers have opposite directions Beneficial effects of the present invention is to provide a display panel and a method of manufacturing the same, by integrally setting a patterned, diverse, and open-type crack prevention structures of various sizes, and various shapes in the frame area and on a side of the encapsulation area adjacent to the frame area, to effectively improve technical problems such as abnormal image quality caused by crack expansion during bending, thereby increasing a number of dynamic bending, wherein the crack prevention structure is filled with an organic layer, which effectively disperses bending stress, thereby reducing the energy required for crack expansion.

BRIEF DESCRIPTION OF DRAWINGS

The following detailed description of specific embodiments of the present application will make the technical solutions and other beneficial effects of the present application obvious in conjunction with the accompanying drawings.

Figure 1:
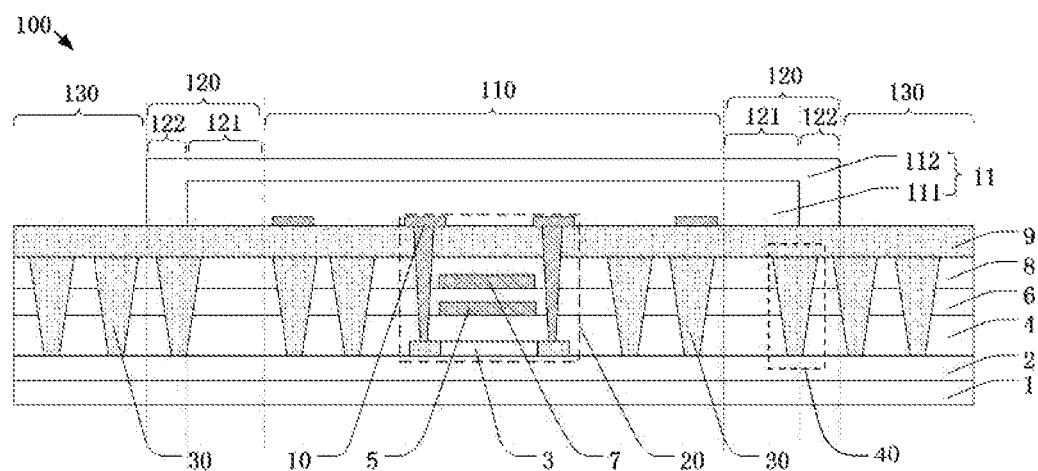
FIG. 1 is a schematic cross-sectional structural diagram of a display panel according to a first embodiment of the present invention.

Elements in the drawings are designated by reference numerals listed below.

1, flexible substrate layer; 2, buffer layer; 3, active layer; 4, first insulating layer;
5, first metal layer; 6, second insulating layer; 7, second metal layer; 8, dielectric layer;
9, organic layer; 10, source/drain metal layer; 11, thin film encapsulation layer; 20, thin film transistor;
30, groove; 31, outer side; 32, inner side; 40, crack prevention structure;
100, display panel; 110, display area; 111, first encapsulation layer; 112, second encapsulation layer;
120, encapsulation area; 121, first encapsulation area; 122, second encapsulation area; 130, frame area.

DETAILED DESCRIPTION OF PREFERRED EMBODIMENTS

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

First Embodiment

Referring to FIG. 1, a first embodiment of the present invention provides a display panel 100 including a flexible substrate layer 1, a buffer layer 2, an active layer 3, a first insulating layer 4, a first metal layer 5, a second insulating layer 6, a second metal layer 7, a dielectric layer 8, an organic layer 9, a source/drain metal layer 10, and a thin film encapsulation layer 11. The thin film encapsulation layer 11 includes a first encapsulation layer 111 and a second encapsulation layer 112.

Figure 2:
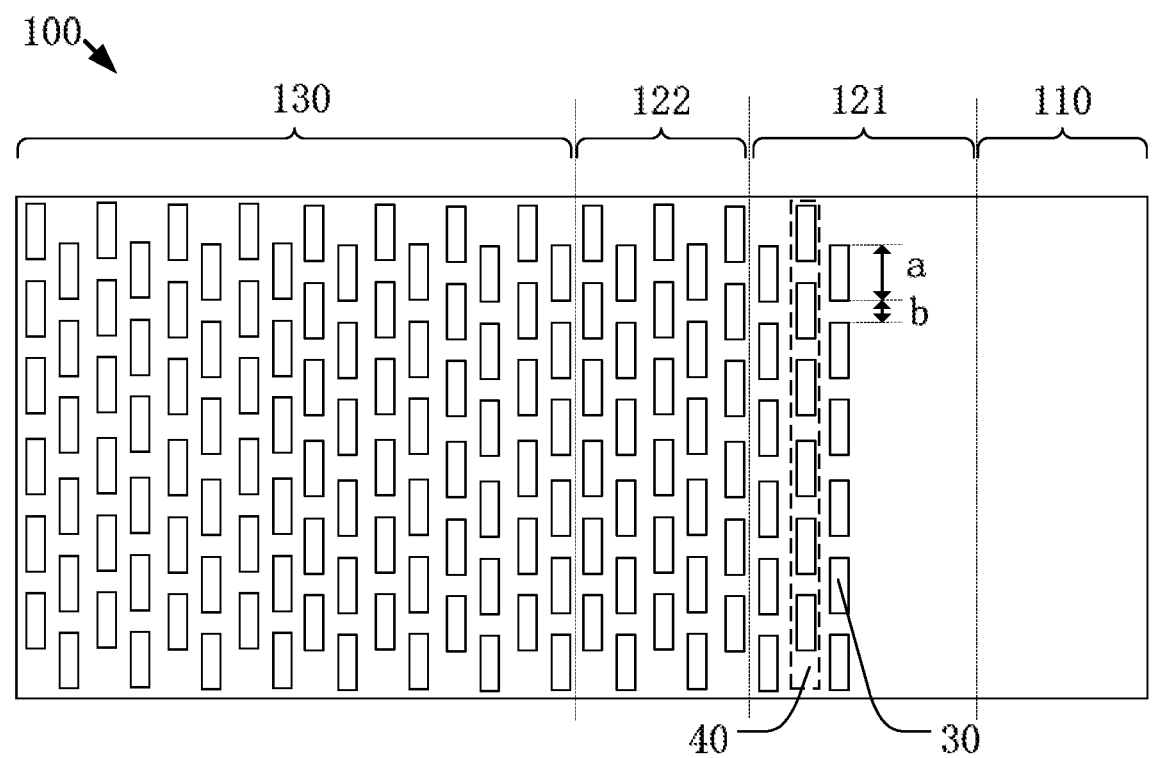
FIG. 2 is a schematic partial plan structural diagram of a display panel according to a first embodiment of the present invention.

Referring to FIG. 1 and FIG. 2. The display panel 100 is provided with a display area 110, an encapsulation area 120, and a frame area 130. The encapsulation area 120 is disposed around the display area 110 and is an area covered by the thin film encapsulation layer 11. The encapsulation area 120 specifically includes a first encapsulation area 121 and a second encapsulation area 122, wherein the first encapsulation area 121 is an area covered by the first encapsulation layer 111, and the second encapsulation area 122 is an area covered by the second encapsulation layer 112. The first encapsulation area 121 is connected to the display area 110 and disposed around the display area 110, and the second encapsulation area 122 is disposed around the first encapsulation area 121, wherein an inner side of the second encapsulation area 121 is connected to the first encapsulation area. 121, an outer side thereof of the second encapsulation area 121 is connected to the frame area 130, and the frame area 130 is disposed around the encapsulation area 120.

The display area 110 includes a plurality of thin film transistors 20, wherein a gate of the thin film transistor 20 is located in the first metal layer 5; and a source and a drain of the thin film transistor 20 are located in the source/drain metal layer 10. The crack prevention structure 40 is disposed in the second encapsulation area 122 and partially disposed on a side of the first encapsulation area 121 adjacent to the frame area 130.

In the display area 110, each of the encapsulation area 120 and the frame area 130 is provided with at least one groove 30, and the groove 30 penetrates the first insulating layer 4, the second insulating layer 6, and the dielectric layer 8 sequentially from bottom to top, and the groove 30 is filled with the organic layer 9. Specifically, the groove 30 and the thin film transistor 20 in the display area 110 are spaced apart, that is, projections of the groove 30 and the thin film transistor 20 on a plane where the display panel 100 is located do not overlap. The grooves are formed into multiple layers of crack prevention structures 40, which are disposed in sequence in the frame area 130 and the second encapsulation area 122 and on a side of the first encapsulation area 121 adjacent to the frame area 130, that is, at least one layer of the multiple layers of the crack prevention structures 40 is disposed in the frame area 130 and on a side of the encapsulation area 120 adjacent to the frame area 130, and each of the multiple layers of the crack prevention structures 40 is present as a dashed circle structure around the display area 110. The crack prevention structure 40 includes at least one groove 30. The groove 30 of one layer of the multiple layers of the crack prevention structures 40 and the groove 30 of another layer of the multiple layers of the crack prevention structures 40 adjacent to the one layer are mutually staggered. In other words, the grooves 30 of one layer of the multiple layers of the crack prevention structures 40 are arranged correspondingly to intervals of the grooves 30 of adjacent one layer of the multiple layers of the crack prevention structures 40; that is, the grooves 30 are in an open-spaced arrangement.

Material of the organic layer 9 includes polyimide, colorless polyimide, or siloxane. The organic layer 9 acts as a buffer to stress and can effectively disperse bending stress, thereby reducing the energy required for crack expansion, to prevent the crack from further expanding.

The groove 30 can provide a certain space for movement, which is equivalent to reducing the stress concentration phenomenon caused by bending and improving the bending resistance of the display panel 100. In addition, even if a crack occurs in a layer of the display panel 100 during an operation such as bending, because the grooves 30 are provided, stress dispersing points can be formed at the grooves 30, so that the cracks can be terminated at the groove 30, thereby preventing the layer from further cracking due to further expansion of the crack, which can not only avoid the short-circuit phenomenon of the thin film transistor 20, but also reduce the possibility of open circuit due to generation of the cracks, thereby improving the operation stability of the described display panel 100. In addition, the grooves 30 constituting the crack prevention structure 40 are staggered with each other so as to prevent cracks from bypassing the crack prevention structure 40 and expanding out from other locations, which ensures that water and oxygen do not oxidize organic compounds in a light-emitting layer, which improves encapsulation performance, thus increasing a service life of the device.

In this embodiment, each of the grooves 30 has a length extending in a direction in which the crack prevention structures 40 surround the display area 110.

Referring to FIG. 2, in this embodiment, the groove 30 is rectangular. In this embodiment, a number of layers of the crack prevention structure 40 is preferably 12, that is, the grooves 30 are arranged in 12 rows.

In this embodiment, an interval distance b between adjacent ones of the grooves 30 in a direction in which the crack prevention structures 40 surround the display area 110 is less than or equal to half of a length of the groove 30, that is, $b \leq a/2$.

In this embodiment, the crack prevention structure 40 is formed by the grooves 30 in an open-spaced arrangement in the frame area 130 and on the side of the encapsulation area 120 adjacent to the frame area 130, and rapid expansion of the cracks in a condition of a small bending radius and external bending can be prevented by adjusting the overall width of the crack prevention structure 40, the relative position between the grooves 30, and sizes of the grooves 30, thus finally ensuring normal display functions. In this embodiment, the groove 30 is further filled with the organic layer to effectively disperse bending stress, thereby reducing the energy required for crack expansion, effectively improving technical problems such as abnormal image quality caused by crack expansion during bending, and improving a number of dynamic bending.

When manufacturing display panel 100, there is no need to increase the number of masks, and without significantly increasing the cost, the problem that the crack expansion impacts an image display of the display panel 100 can be effectively improved.

Second Embodiment

Figure 3:
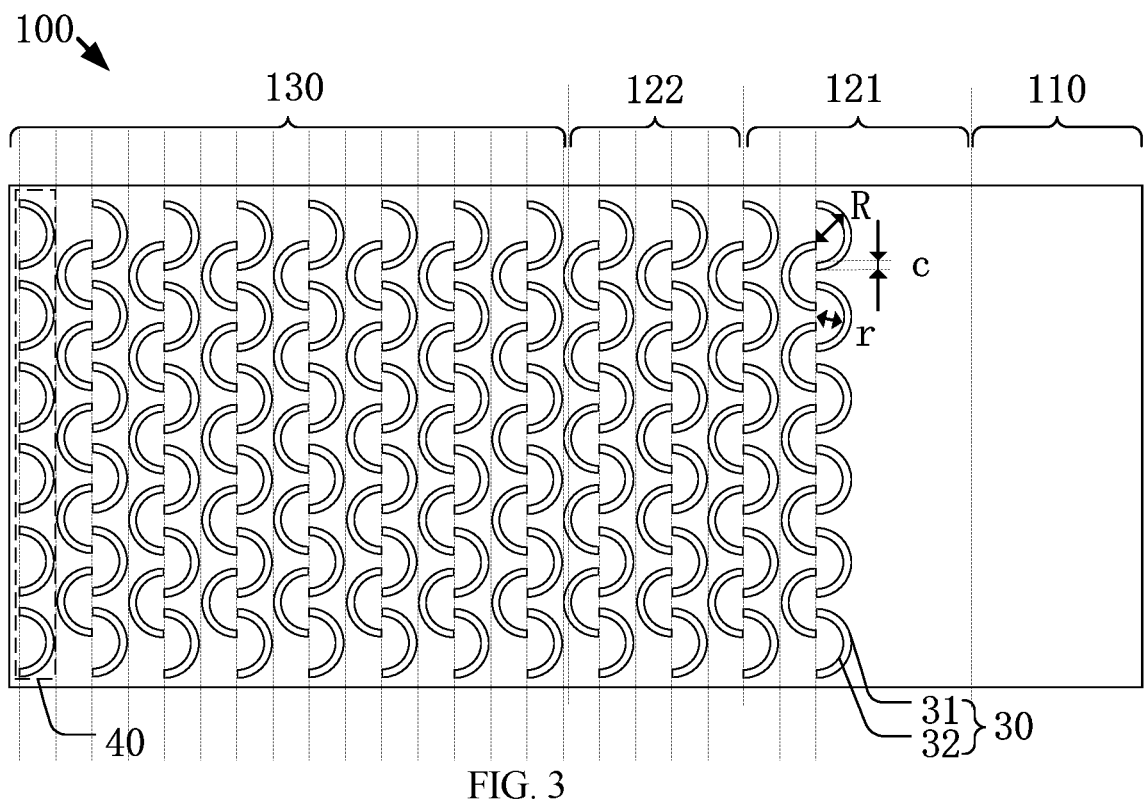
FIG. 3 is a schematic plan view of a display panel according to a second embodiment of the present invention.

Referring to FIG. 3, a display panel 100 is provided in a second embodiment, including most of the technical features in the Example 1, except that a shape of the groove 30 in the second embodiment is different from that in the first embodiment. In the second embodiment, the groove 30 has a semicircular fan shape.

In this embodiment, openings of the grooves 30 of the crack prevention structures 40 located in two adjacent layers have opposite directions.

In this embodiment, an interval distance between adjacent ones of the grooves 30 in a direction in which the crack prevention structures 40 surround the display area 110 is equal to a width of the grooves 30.

As shown in FIG. 3, in this embodiment, the groove 30 includes an outer side 31 and an inner side 32. The outer side 31 has a semicircular arc shape, and a diameter of a circle where the outer side 31 is located is R. The inner side 32 also has a semicircular arc shape, and the inner side 32 and the outer side 31 are concentric circles. A diameter r of a circle where the inner side 32 is located is smaller than the diameter R of the circle where the outer side 31 is located. A difference R-r between the diameter of the circle where the outer side 31 is located and the diameter of the circle where the inner side 32 is located is greater than or equal to 2 times the width of the groove 30 and less than or equal to 3 times the width c of the groove 30, that is $3c \geq R-r \geq 2c$.

In addition, the semicircular fan shaped grooves 30 constituting the crack prevention structure 40 are staggered with each other, which can prevent cracks from bypassing the crack prevention structure 40 and expanding out from other locations, which ensures that water and oxygen do not oxidize organic compounds in a light-emitting layer, which improves encapsulation performance, thus increasing a service life of the device.

The groove 30 has a semicircular fan shape, which is equivalent to reducing the stress concentration phenomenon caused by bending and improving the bending resistance of the display panel 100. In addition, even if a crack occurs in a layer of the display panel 100 during an operation such as bending, because the grooves 30 are provided, stress dispersing points can be formed at the grooves 30, so that the cracks can be terminated at the groove 30, thereby preventing the layer from further cracking due to further expansion of the crack, which can not only avoid the short-circuit phenomenon of the thin film transistor 20, but also reduce the possibility of open circuit due to generation of the cracks, thereby improving the operation stability of the described display panel 100.

The groove 30 is filled with a material same as the organic layer 9, including polyimide, colorless polyimide, or siloxane, which acts as a buffer to stress and can effectively disperse bending stress, thereby reducing the energy required for crack expansion, to prevent the crack from further expanding. Increasing the groove 30 and filling with the organic material can further improve effect of the buffering to bending stress, and can further effectively disperse the bending stress, thereby reducing the energy required for crack expansion and preventing the crack from further expanding. During bending, stress can be dispersed through these uniformly distributed grids of organic material, thereby protecting the structural integrity of the display panel 100.

When manufacturing display panel 100, there is no need to increase the number of masks, and without significantly increasing the cost, the problem that the crack expansion impacts an image display of the display panel 100 can be effectively improved.

Third Embodiment

Figure 4:
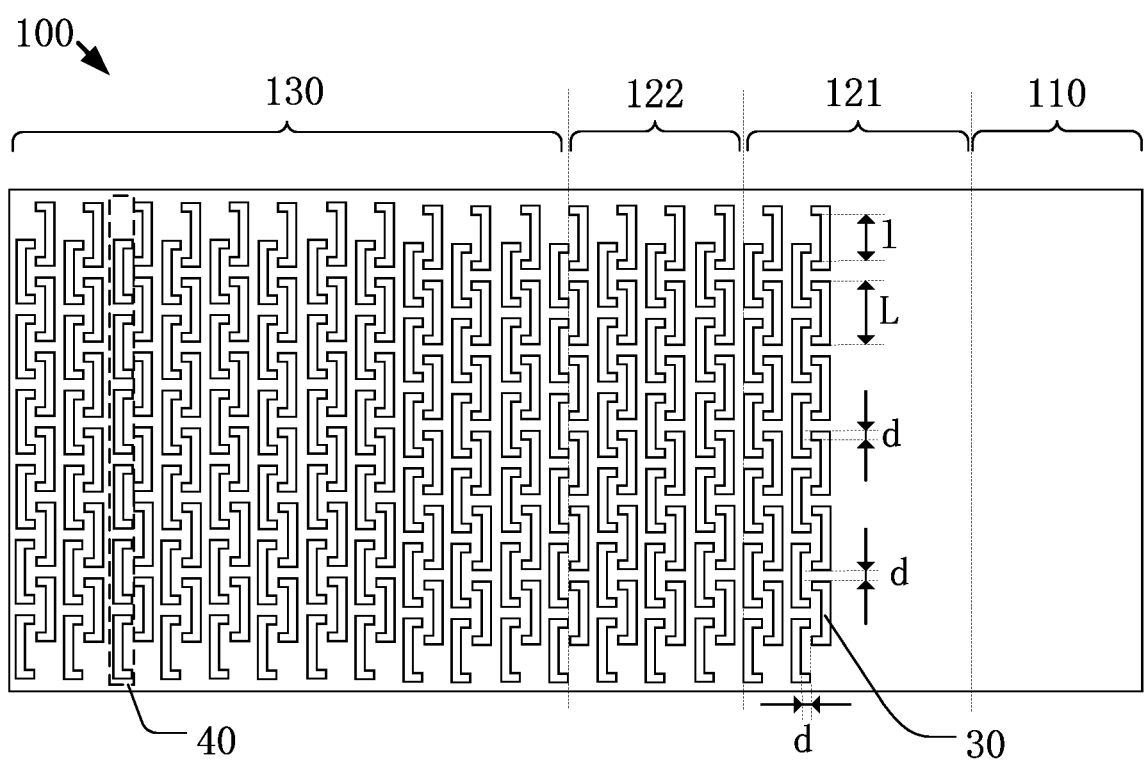
FIG. 4 is a schematic plan view of a display panel according to a third embodiment of the present invention.

Referring to FIG. 4, a third embodiment provides a display panel 100 including most of the technical features of the second embodiment, except that the groove 30 in the third embodiment is U-shaped, which is different from the semicircular fan shape of the groove 30 in the second embodiment.

In this embodiment, openings of the grooves 30 of the crack prevention structures 40 located in two adjacent layers have opposite directions. It can be known that the groove 30 in the third embodiment is different from the groove 30 in the second embodiment only in the specific shape and size.

As shown in FIG. 4, in this embodiment, an interval distance between two adjacent grooves 30 is equal to a width of the grooves 30. Preferably, the interval distance between two adjacent grooves 30 in any direction is equal to the width of the grooves 30, both of which are d.

In this embodiment, the notch width l of the groove 30 is greater than or equal to 4 times the width d of the groove 30, that is, l≥4d. The length L of the groove 30 is greater than or equal to 7 times the width d of the groove 30, that is, L≥7d.

In addition, the U-shaped grooves 30 constituting the crack prevention structure 40 are staggered with each other, which can prevent cracks from bypassing the crack prevention structure 40 and expanding out from other locations, which ensures that water and oxygen do not oxidize organic compounds in a light-emitting layer, which improves encapsulation performance, thus increasing a service life of the device.

The U-shaped groove 30 can also provide a certain space for movement, which is equivalent to reducing the stress concentration phenomenon caused by bending and improving the bending resistance of the display panel 100. In addition, even if a crack occurs in a layer of the display panel 100 during an operation such as bending, because the grooves 30 are provided, stress dispersing points can be formed at the grooves 30, so that the cracks can be terminated at the groove 30, thereby preventing the layer from further cracking due to further expansion of the crack, which can not only avoid the short-circuit phenomenon of the thin film transistor 20, but also reduce the possibility of open circuit due to generation of the cracks, thereby improving the operation stability of the described display panel 100.

The groove 30 is filled with a material same as the organic layer 9, including polyimide, colorless polyimide, or siloxane, which acts as a buffer to stress and can effectively disperse bending stress, thereby reducing the energy required for crack expansion, to prevent the crack from further expanding. Increasing the groove 30 and filling with the organic material can further improve effect of the buffering to bending stress, and can further effectively disperse the bending stress, thereby reducing the energy required for crack expansion and preventing the crack from further expanding. During bending, stress can be dispersed through these uniformly distributed grids of organic material, thereby protecting the structural integrity of the display panel 100.

When manufacturing display panel 100, there is no need to increase the number of masks, and without significantly increasing the cost, the problem that the crack expansion impacts an image display of the display panel 100 can be effectively improved.

Beneficial effects of the present invention is to provide a display panel and a method of manufacturing the same, by integrally setting a patterned, diverse, and open-type crack prevention structures of various sizes, and various shapes in the frame area of the display panel, to effectively improve technical problems such as abnormal image quality caused by crack expansion during bending, thereby increasing a number of dynamic bending, wherein the crack prevention structure is filled with an organic layer, which effectively disperses bending stress, thereby reducing the energy required for crack expansion.

The above is only a preferred embodiment of the present invention. It should be noted that for those of ordinary skill in the art, without departing from the principles of the present invention, several improvements and retouches can be made, which should be regarded as the protection scope of the present invention.

What is claimed is:

1. A display panel, provided with a display area, an encapsulation area, and a frame area, wherein the encapsulation area comprises:
   a first encapsulation area connected to the display area and disposed around the display area; and
   a second encapsulation area disposed around the first encapsulation area, and having an inner side connected to the first encapsulation area and an outer side connected to the frame area;
   wherein multiple layers of crack prevention structures are disposed in sequence in the frame area and the second encapsulation area and on a side of the first encapsulation area adjacent to the frame area, and each of the multiple layers of the crack prevention structures are present as a dashed circle structure around the display area;
   each of the crack prevention structures comprises at least one groove; grooves of one layer of the multiple layers of the crack prevention structures and grooves of another layer of the multiple layers of the crack prevention structures adjacent to the one layer are mutually staggered; and
   the encapsulation area and the frame area comprise a flexible substrate layer, a buffer layer, a first insulating layer, a second insulating layer, a dielectric layer, and an organic layer sequentially stacked from bottom to top, the grooves penetrate the first insulating layer, the second insulating layer, and the dielectric layer sequentially from bottom to top, and the grooves are filled with the organic layer.

2. The display panel according to claim 1, wherein each of the grooves has a length extending in a direction in which the crack prevention structures surround the display area.

3. The display panel according to claim 1, wherein the grooves are rectangular.

4. The display panel according to claim 3, wherein an interval distance between adjacent ones of the grooves in a direction in which the crack prevention structures surround the display area is less than or equal to half of a length of the groove.

5. The display panel according to claim 1, wherein each of the grooves has a semicircular fan shape.

6. The display panel according to claim 5, wherein an interval distance between adjacent ones of the grooves in a direction in which the crack prevention structures surround the display area is equal to a width of the grooves.

7. The display panel according to claim 5, wherein the grooves comprise:
   an outer side having a semicircular arc shape; and
   an inner side having a semicircular arc shape, wherein the inner side and the outer side are concentric circles, a diameter of a circle where the inner side is located is smaller than a diameter of a circle where the outer side is located, a difference in diameter between the circle in which the inner side is located and the circle where the outer side is located is greater than or equal to 2 times a width of each of the grooves and less than or equal to 3 times the width of each of the grooves.

8. The display panel according to claim 1, wherein each of the grooves has a U-shape.

9. The display panel according to claim 8, wherein an interval distance between adjacent ones of the grooves is equal to a width of the grooves.

10. The display panel according to claim 8, wherein a notch width of each of the grooves is greater than or equal to 4 times a width of each of the grooves; and a length of each of the grooves is greater than or equal to 7 times the width of each of the grooves.

11. The display panel according to claim 5, wherein openings of the grooves of the crack prevention structures located in two adjacent layers of the multiple layers have opposite directions.

\* \* \* \* \*